United States Patent
Kim et al.

(10) Patent No.: US 7,391,669 B2
(45) Date of Patent: Jun. 24, 2008

(54) SEMICONDUCTOR MEMORY DEVICE AND CORE LAYOUT THEREOF

(75) Inventors: Hye-jin Kim, Seoul (KR);
Choong-keun Kwak, Suwon-si (KR);
Woo-yeong Cho, Suwon-si (KR);
Sang-beom Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/316,878

(22) Filed: Dec. 27, 2005

(65) Prior Publication Data

US 2006/0215480 A1 Sep. 28, 2006

(30) Foreign Application Priority Data

Mar. 24, 2005 (KR) .................. 10-2005-0024542

(51) Int. Cl.
*G11C 8/00* (2006.01)

(52) U.S. Cl. .............. 365/230.06; 365/163; 365/230.03

(58) Field of Classification Search ............. 365/230.06
See application file for complete search history.

(56) References Cited

U.S. PATENT DOCUMENTS

| | | | | |
|---|---|---|---|---|
| 5,883,827 A | * | 3/1999 | Morgan .................. | 365/100 |
| 5,940,343 A | * | 8/1999 | Cha et al. .............. | 365/230.06 |
| 6,002,635 A | * | 12/1999 | Matano ................. | 365/230.06 |
| 6,026,047 A | * | 2/2000 | Ryu et al. .............. | 365/230.06 |
| 6,111,808 A | * | 8/2000 | Khang et al. ........... | 365/230.06 |
| 6,229,755 B1 | * | 5/2001 | Oh ........................ | 365/230.06 |
| 6,249,477 B1 | * | 6/2001 | Ohtsuki ................. | 365/230.06 |
| 6,477,105 B2 | * | 11/2002 | Aritomi et al. ......... | 365/230.03 |
| 6,954,398 B2 | * | 10/2005 | Ninomiya et al. ...... | 365/230.06 |
| 7,123,535 B2 | * | 10/2006 | Kurotsuchi et al. ..... | 365/225.7 |
| 2003/0123284 A1 | | 7/2003 | Lowrey et al. | |
| 2003/0174530 A1 | | 9/2003 | Tran | |
| 2005/0270883 A1 | * | 12/2005 | Cho et al. .............. | 365/230.03 |
| 2006/0126380 A1 | * | 6/2006 | Osada et al. ........... | 365/163 |

FOREIGN PATENT DOCUMENTS

| KR | 1020000027267 A | 5/2000 |
|---|---|---|
| KR | 1020040074088 | 8/2004 |

* cited by examiner

*Primary Examiner*—Son L. Mai
(74) *Attorney, Agent, or Firm*—Volentine & Whitt, PLLC

(57) ABSTRACT

A semiconductor memory device of one aspect includes a memory cell block including n global word lines, and corresponding m sub word lines for each of the n global word lines, where n and m are natural numbers. The memory device further includes a plurality of word line driving circuits which respectively control a voltage of the sub word lines according to a logic level of each corresponding global word line and inputted address signals, and a plurality of control circuits which transmit the address signals to the word line driving circuits or interrupt transmission of the address signals according to the logic level of the global word line. Each of the word line driving circuits includes a first transistor which maintains the voltage of the respective sub word line at a first voltage and a second transistor which maintains the voltage of the sub word line at the first voltage or a second voltage.

29 Claims, 7 Drawing Sheets

SEMICONDUCTOR MEMORY DEVICE AND CORE LAYOUT THEREOF

BACKGROUND OF THE INVENTION

1. Field of the Invention

The present invention generally relates to semiconductor memory devices, and more particularly, the present invention relates to the core layout of semiconductor memory devices.

A claim of priority is made to Korean Patent Application No. 10-2005-0024542, filed on Mar. 24, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIG. 1 is an equivalent circuit diagram of an example of a phase change memory cell C of a diode type PRAM. In this example, the memory cell C includes a phase change resistance element GST and a diode D connected in series between a bit line BL and a word line WL. The phase change memory cell C is either selected or non-selected (e.g., for programming) depending on the voltage level of the word line WL. In particular, the memory cell C is selected by driving the word line WL to ground, whereas the memory cell C is non-selected by maintaining the word line WL at some constant voltage.

FIG. 2 is a circuit diagram for explaining the write circuitry associated with a conventional phase change memory device 200.

Referring to FIG. 2, the phase change memory device 200 includes a memory cell block CBLK, a word line driving unit 210, a column selection circuit 220, and a write driver 230. The memory cell block CBLK includes a plurality of phase change memory cells of the type illustrated in FIG. 1.

The column selection circuit 220 connects one of a plurality of bit lines BL0-BLk to the write driver 230 in accordance with a plurality of column selection signals Y0-Yk. The write driver 230 supplies a write current to the selected bit line The word line driving unit 210 drives word lines WL0, WL1, and WL2 of the illustrated memory cell block CBLK. The word line driving unit 210 includes a plurality of word line driving circuits for decoding address signals ADD and activation signals EN. In the example of FIG. 2, each word line driving circuit WDC includes a NOR gate N1 and an inverter I1. As such, when both the applied address signal ADD and the applied activation signal EN are LOW, the corresponding word line WL is driven to ground VSS. If either or both the applied address signal ADD and the applied activation signal EN are HIGH, the corresponding word line WL is maintained at the voltage VDD.

The dashed line of FIG. 2 extending along the bit line BLk and the word line WL0 is representative of the current path in the case where the memory cell at the intersection of the bit line BLk and the word line WL0 is selected. As suggested previously, in this case, the word line WL0 is maintained at a ground voltage VSS by operation of the logic gates contained in the word line driving unit 210.

However, when the word line driving circuit connected to each of the word lines WL0, WL1, and WL2 includes logic gate circuits such as the NOR unit N1 and the inverter I1 shown in FIG. 2, the layout size of the word line driving circuit is increased, making it difficult to implement a highly integrated semiconductor memory device.

SUMMARY OF THE INVENTION

According to an aspect of the present invention, a semiconductor memory device is provided which includes a memory cell block including n global word lines, and corresponding m sub word lines for each of the n global word lines, where n and m are natural numbers. The memory device further includes a plurality of word line driving circuits which respectively control a voltage of the sub word lines according to a logic level of each corresponding global word line and inputted address signals, and a plurality of control circuits which transmit the address signals to the word line driving circuits or interrupt transmission of the address signals according to the logic level of the global word line. Each of the word line driving circuits includes a first transistor which maintains the voltage of the respective sub word line at a first voltage and a second transistor which maintains the voltage of the sub word line at the first voltage or a second voltage.

According to another aspect of the present invention, a semiconductor memory device is provided which includes a memory cell block including n global word lines and m sub word lines for each of the global word lines. One of the sub word lines is selected in response to an activated global word line among the global word lines, j-bit first address signals and k-bit second address signals. The memory device further includes a word line driving unit, corresponding to the memory cell block, which drives the sub word lines, and which includes n×m word line driving circuits which maintain non-selected sub word lines at a first voltage and a selected sub word line at a second voltage. Here, j, k, m and n are natural numbers.

According to still another aspect of the present invention, a semiconductor memory device is provided which includes a plurality of memory cell blocks each including n global word lines and corresponding m sub word lines for each of the n global word lines, wherein one of the sub word lines is selected in response to an activated global word line among the global word lines, j-bit first address signals and k-bit second address signals. The memory device further includes a plurality of word line driving units, respectively corresponding to the memory cell blocks, which drive the sub word lines inside the memory cell blocks, and including n×m word line driving circuits which maintain non-selected sub word lines at a first voltage and a selected sub world line at a second voltage. The memory device still further includes a first decoding unit which decodes the first address signals and the second address signals and applies the first and second address signals to the word line driving unit. Here, j, k, m and n are natural numbers and j×k=m.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

Figure 1:
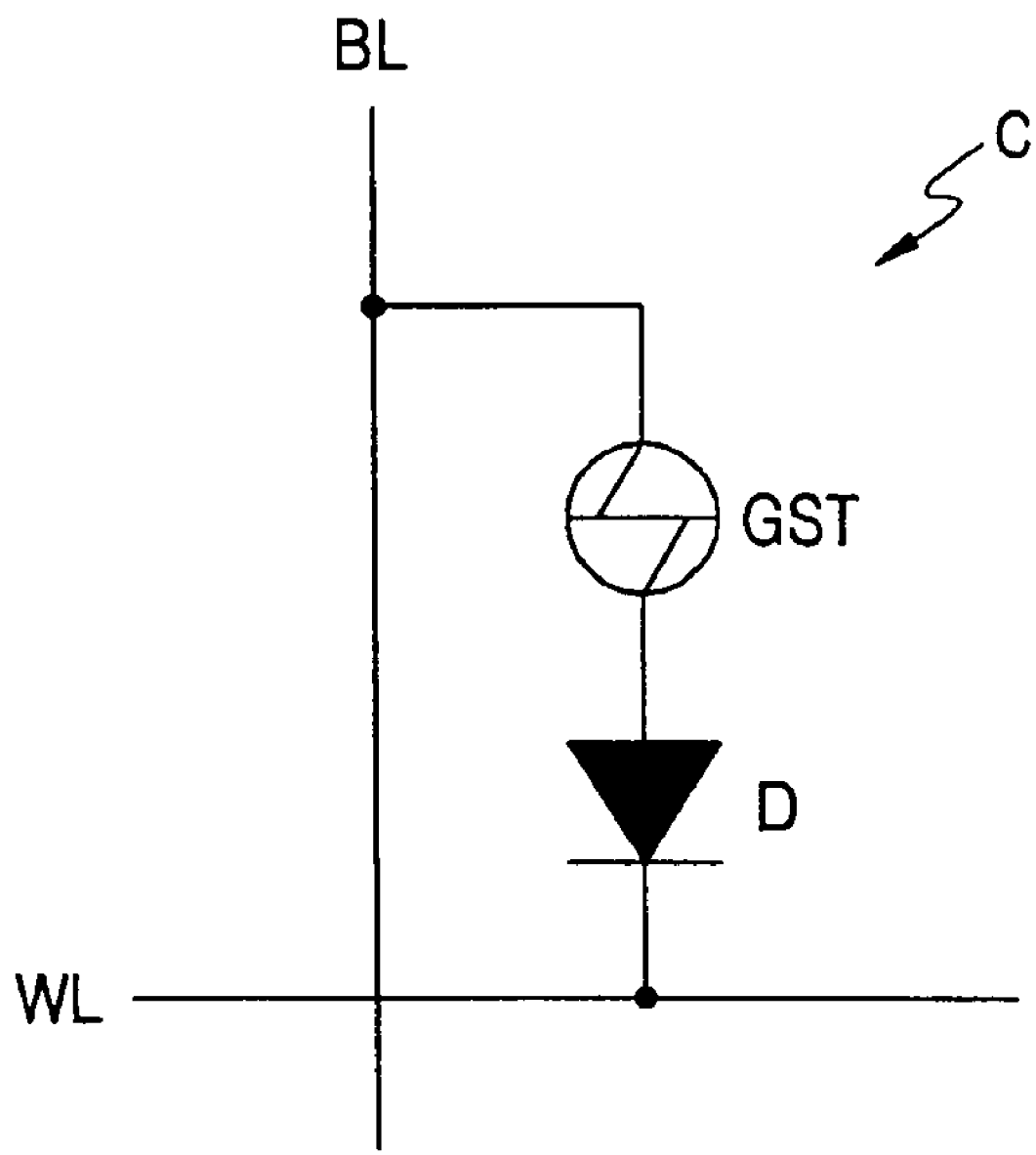
FIG. 1 is a circuit diagram of a conventional phase change memory cell C.

The attached drawings illustrating exemplary embodiments of the present invention are referred to in order to gain a sufficient understanding of the present invention, the merits thereof, and the objectives accomplished by the implementation of the present invention.

Hereinafter, the present invention will be described in detail by explaining exemplary, but non-limiting, embodiments of the invention with reference to the attached drawings. Like reference numerals in the drawings denote like elements.

Figure 3:
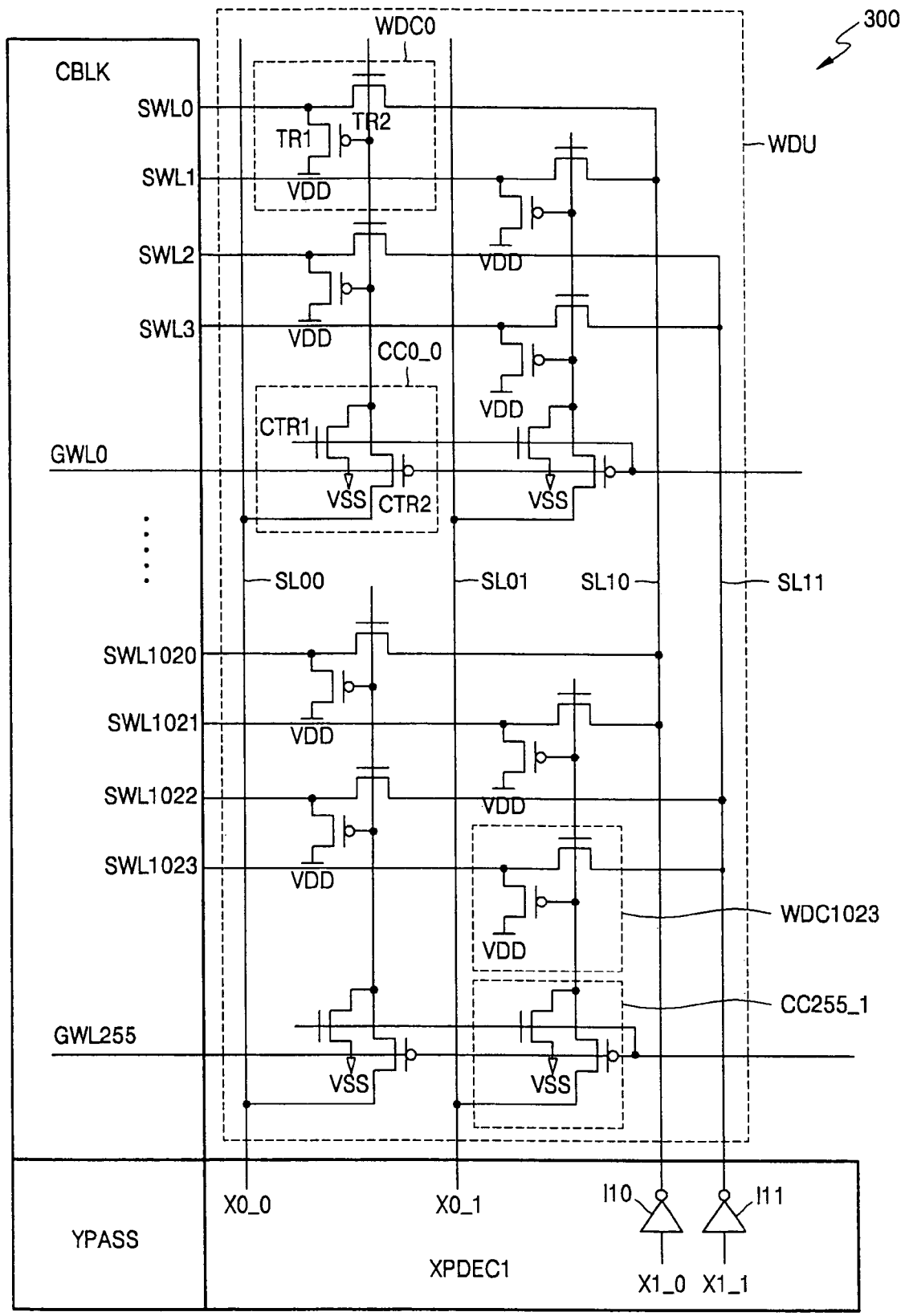
FIG. 3 is a circuit diagram of a semiconductor memory device according to an embodiment of the present invention.

FIG. 3 is a circuit diagram of a semiconductor memory device 300 according to an embodiment of the present invention. Referring to FIG. 3, the semiconductor memory device 300 of this example includes a memory cell block CBLK including n global word lines GWL0-GWLn−1, n×m sub word lines SWL0-SWL(n×m−1), where m of the sub word lines SWL correspond to each of the global word lines GWL0-GWLn−1, n×m word line driving circuits WDC0-WDC (n×m−1). The memory cell block CBLK also includes sets of n control circuits CC0_0-CCn−1_1.

Both n and m are natural numbers, and in the explanation that follows, examples are presented where n is 256 and m is 4. As such, the semiconductor memory device 300 of FIG. 3 includes 256 global word lines GWL0-GWL255, and 1024 sub word lines SWL0-SWL1023, where 4 sub word lines are connected to each global line. However, the number of global word lines and sub word lines is not limited to the given examples and can be varied according to the capacity of the semiconductor memory device 300.

Referring to FIG. 3, a column selection circuit YPASS selects a bit line (not shown) of the memory cell block CBLK. The word line driving circuits WDC0-WDC1023 and the control circuits CC0_0-CC255_1 form a word line driving unit WDU.

The word line driving circuits WDC0-WDC1023 control the voltages of corresponding sub word lines SWL0-SWL1023 inside the memory cell block CBLK according to the logic levels of the global word lines GWL0-GWL255 and inputted address signals X0_0-X1_1.

The control circuits CC0_0-CC255_1 respectively transmit the address signals X0_0-X1_1 to the word line driving circuits WDC0-WDC1023 or cut them off according to the logic levels of the global word lines GWL0-GWL255. Each of the control circuits CC0_0-CC255_1 includes a first control transistor CTR1 and a second control transistor CTR2.

Each of the word line driving circuits WDC0-WDC1023 includes a first transistor TR1 which maintains the voltage of the corresponding sub word lines SWL0-SWL1023 at a first voltage and a second transistor TR2 which maintains the voltage of the corresponding sub word lines SWL0-SWL1023 at the first voltage or a second voltage.

The address signals X0_0, X0_1, X1_0, and X1_1 include j (natural number)-bit first address signals X0_0 and X0_1 controlling the corresponding word line driving circuits WDC0-WDC1023 and k (natural number)-bit second address signals X1_0 and X1_1 controlling the voltage of the corresponding sub word lines SWL0-SWL1023. Here, the product of j and k is m.

Since there are two first address signals X0_0 and X0_1 and two second address signals X1_0 and X1_1 in FIG. 3, j and k are each 2. However, j and k can be varied from the given example and are not limited in this respect.

In the semiconductor memory device 300, since each of the word line driving circuits WDC0-WDC1023 is implemented with two transistors TR1 and TR2, the layout size of the word line driving unit WDU including the word line driving circuits WDC0-WDC1023 can be reduced. Thus, the size of the core layout of the semiconductor memory device 300 can be reduced and the integration of a fabricated chip can be improved.

Figure 2:
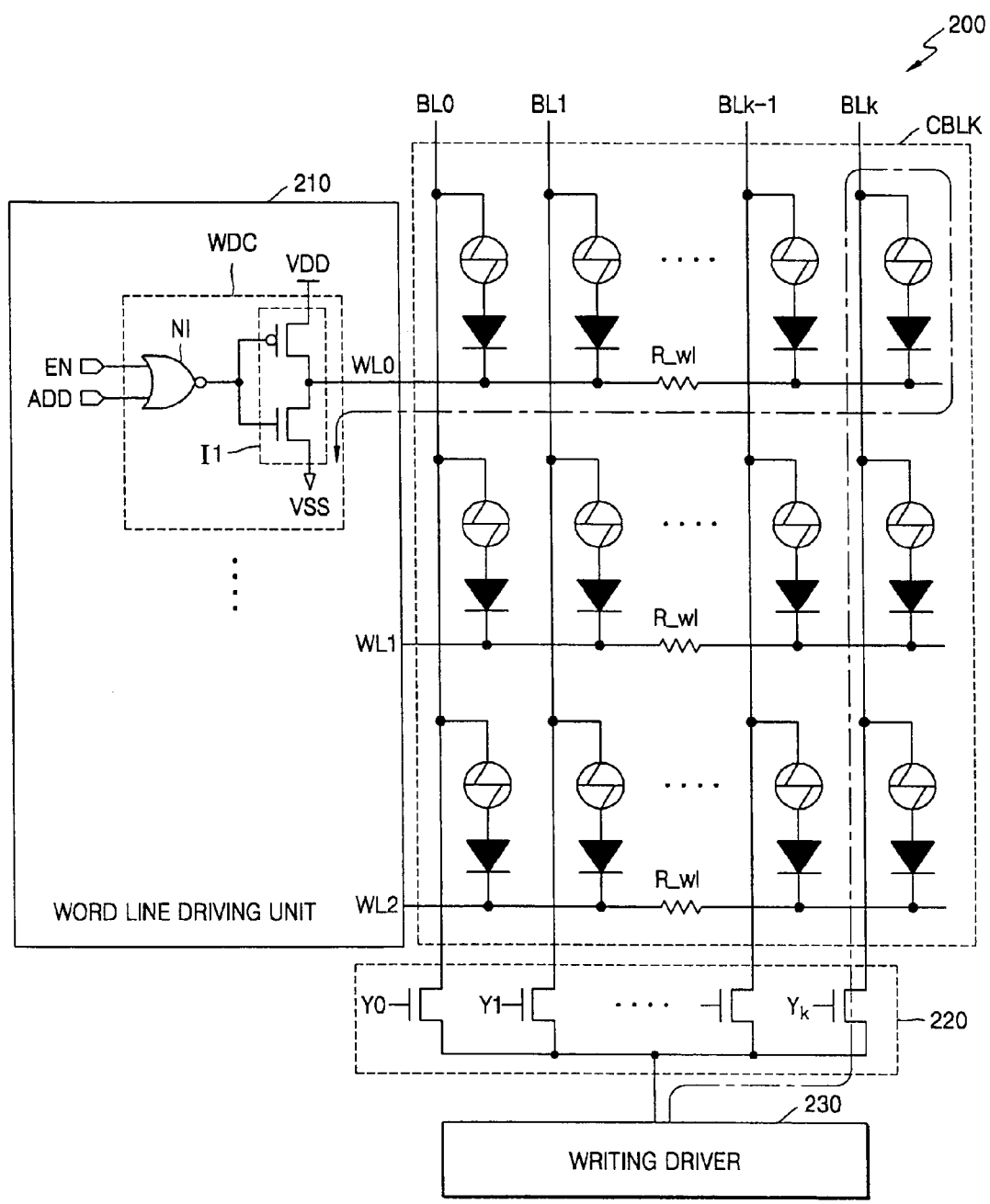
FIG. 2 is a circuit diagram of a conventional phase change memory device.

In the semiconductor memory device 300 of FIG. 3, the number of metal lines SL00-SL11, via which the address signals X0_0, X0_1, X1_0, and X1_1 are applied to the word line driving unit WDU, is less than the number of metal lines in the conventional semiconductor memory device 200 shown in FIG. 2, and thus, it is relatively easy to increase the number of sub word lines corresponding to each of the global word lines. Alternatively, when the number of the sub word lines is not increased, a reduction of the number of metal lines results in a size reduction.

The structures of the word line driving circuits WDC0-WDC1023 and the control circuits CC0_0-CC255_1 will be described in detail. Since the structures of all word line driving circuits WDC0-WDC1023 are identical, the structures of a first word line driving circuit WDC0 and a first control circuit CC0_0 will be representatively described.

The first control transistor CTR1 included in the first control circuit CC0_0 has a first terminal connected to gates of the first and second transistors TR1 and TR2 of the first word line driving circuit WDC0, a second terminal connected to a ground voltage VSS and a gate connected to the first global word line GWL0.

The second control transistor CTR2 has a first terminal connected to the first terminal of the first control transistor CTR1, a second terminal receiving the first address signal X0_0 and a gate connected to the first global word line GWL0.

The first transistor TR1 of the first word line driving circuit WDC0 has a first terminal connected to a first voltage source VDD at the first voltage, a gate connected to the first terminal of the first control transistor CTR1 and a second terminal connected to the first sub word line SWL0.

The second transistor TR2 has a first terminal connected to the first sub word line SWL0, a gate connected to the gate of the first transistor TR1 and a second terminal receiving the second address signal X1_0.

The first voltage is a supply voltage or a predetermined voltage obtained by clamping the supply voltage, and is greater than the second voltage. Although the first voltage source VDD of FIG. 3 is a power source voltage VDD, the first voltage source is not limited to VDD and may be at a predetermined voltage greater than the second voltage. The second voltage is a ground voltage.

The semiconductor memory device 300 further includes k first inverters 110 and 111 which invert the second address signals X1_0, X1_1 and include output terminals connected to the second terminals of the second transistors of the corresponding word line driving circuits WDC0-WDC1023. The k first inverters I10 and I11 form a first decoding unit XPDEC1.

When the first global word line GWL0 is at a first logic level, the first word line driving circuit WDC0 maintains the voltage of the first sub word line SWL0 at the first voltage, and when the first global word line GWL0 is at a second logic level and the first address signal X0_0 is at the first logic level, the first word line driving circuit WDC0 maintains the first sub word line SWL0 at the first voltage or the second voltage according to the logic level of the second address signal X1_0.

The operation of the semiconductor memory device 300 will now be described with reference to FIG. 3.

When the global word line GWL0 is at the first logic level, that is, a high logic level, the first control transistor CTR1 of the control circuit CC0_0 is turned on and the second control transistor CTR2 is turned off.

The turned on first control transistor CTR1 applies a signal at a ground voltage to gates of the first and second transistors TR1 and TR2. Then, the second transistor TR2 is turned off and the first transistor TR1 is turned on so that the first sub word line SWL0 is at the voltage of the first voltage source VDD, that is, at the first voltage.

In this way, when the global word line GWL0 is at the first logic level, the first through fourth sub word lines SWL0-SWL3 are at the first voltage.

When the global word line GWL0 is at the second logic level, that is, a low logic level, the first control transistor CTR1 of the control circuit CC0_0 is turned off and the second control transistor CTR2 is turned on.

The turned on second control transistor CTR2 applies the first address signal X0_0 to the gates of the first and second transistors TR1 and TR2 of the first word line driving circuit WDC0.

It is assumed that the first address signal X0_0 is at a high logic level, the first address signal X0_1 is at a low logic level, the second address signals X1_0 and X1_1 is at a high level, and the other X1_1 is at a low level.

The first address signal X0_0 at a high logic level turns on the second transistor TR2 and turns off the first transistor TR1. The second address signal X1_0 at a high logic level turns on an NMOS transistor (not shown) of the first inverter I10, and therefore a current path is formed between the second transistor TR2 and a ground source (not shown) connected to the NMOS transistor of the first inverter I10.

Thus, the sub word line SWL0 is at the ground voltage, and the current stored in the memory cell (not shown) connected to the sub word line SWL0 is discharged.

The second transistor TR2 connected to the third sub word line SWL2 is turned on by the first address signal X0_0 at a high logic level. However, since the first inverter I11 inverts the second address signal X1_1 at a low logic level and applies the second address signal X1_1 to the second terminal of the second transistor TR2, the third sub word line SWL2 is precharged to a high logic level.

Since the first transistors TR1 of the word line driving circuit WDC0 corresponding to the second and fourth sub word lines SWL1 and SWL3 are turned on by the first address signal X0_1 at a low logic level, the second and fourth sub word lines SWL1 and SWL3 are maintained at the first voltage.

The sub word line selected according to the voltage level of the global word line and the logic levels of the first and second address signals X0_0, X0_1, X1_0, and X1_1 discharges the current stored in the connected memory cell. Further, the remaining word lines, which are not selected, are precharged to the first voltage, and hence leakage current is prevented.

The semiconductor memory device 300 further includes memory cells (not shown) respectively connected to the sub word lines SWL0-SWL1023. The memory cells are phase change random access memories (PRAMs).

Each of the memory cells includes a diode and a phase change resistance element connected between a corresponding bit line and a corresponding sub word line.

As described above, in the semiconductor memory device 300 of FIG. 3, the word line driving circuit can be implemented with only two transistors and the number of the metal lines SL00-SL11, which transmit the address signals X0_0, X0_1, X1_0, and X1_1, is reduced, and thus the size of a memory core layout is reduced and a stable current sensing operation can be performed.

Figure 4:
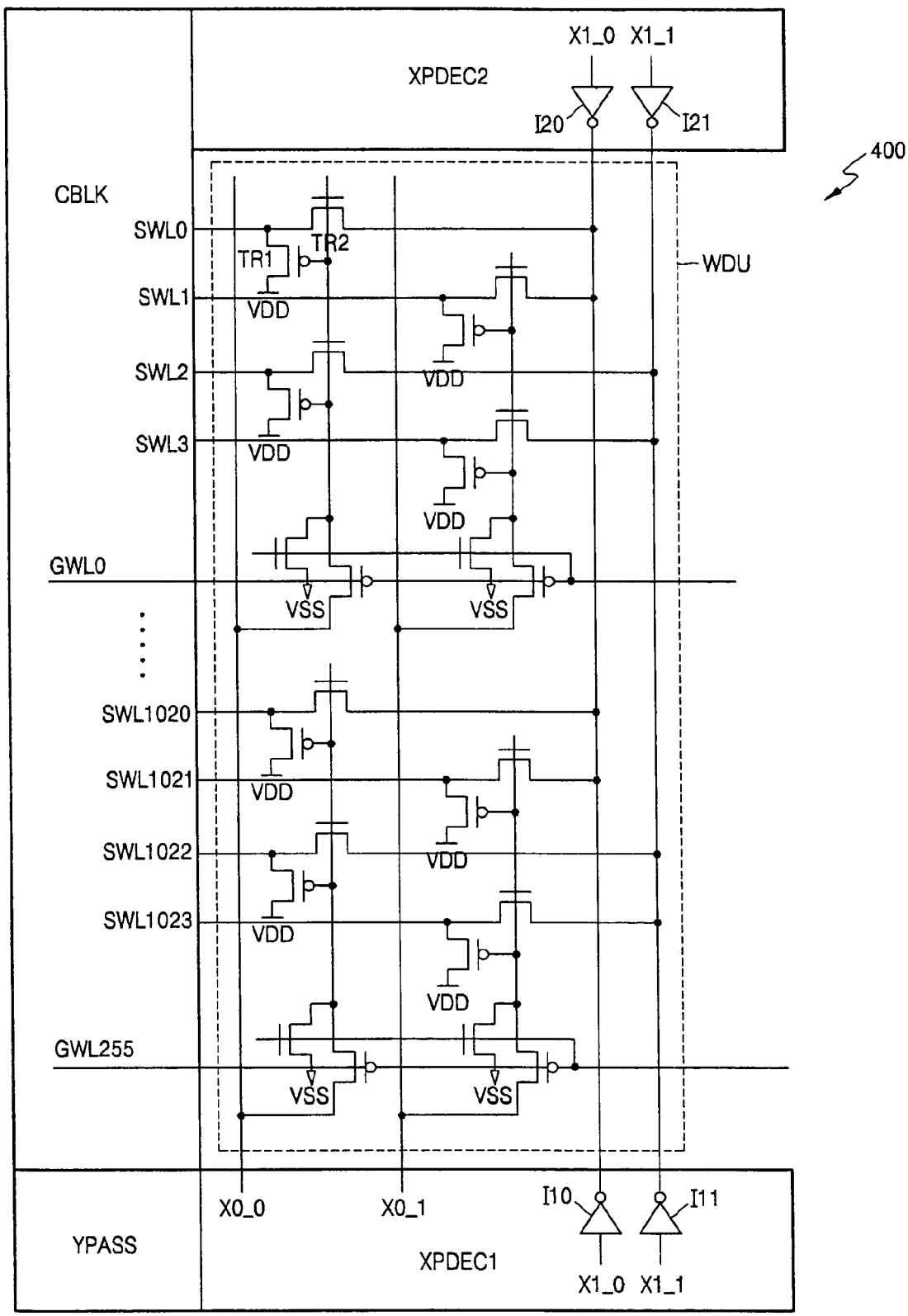
FIG. 4 a circuit diagram of a semiconductor memory device according to another embodiment of the present invention.

FIG. 4 is a circuit diagram of a semiconductor memory device 400 according to another embodiment of the present invention.

The structure of the semiconductor memory device 400 of FIG. 4 is the same as the structure of the semiconductor memory device 300 of FIG. 3, except the semiconductor memory device 400 of FIG. 4 includes a second decoding unit XPDEC2.

The second decoding unit XPDEC2 includes k second inverters 120 and 121 which invert the inputted second address signal X1_0 and X1_1. Each of the k second inverters I20 and I21 has an output terminal connected to the second terminal TR2 of the second transistor of a corresponding word line driving circuit.

The output terminals of the first inverters I10 and I11 and the second inverters 120 and 121, which receive the second address signals X1_0 and X1_1, are connected to each other.

In the semiconductor memory device 400 of FIG. 4, the first and second inverters I10 and I11, and I20 and I21 connected to the second terminals of the second transistors TR2 of the word line driving circuits WDC0-WDC1023 are disposed on both upper and lower sides of the word line driving unit WDU such that the voltage of the sub word lines are controlled from both sides.

Thus, the resistance of the sub word lines SWL0-SWL1023 of the semiconductor memory device 400 of FIG. 4 is half the resistance of the sub word lines SWL0-SWL1023 of the semiconductor memory device 300 of FIG. 3. Thus, the pitch of metal lines connected to the second terminal of the second transistor can be reduced.

Figure 5:
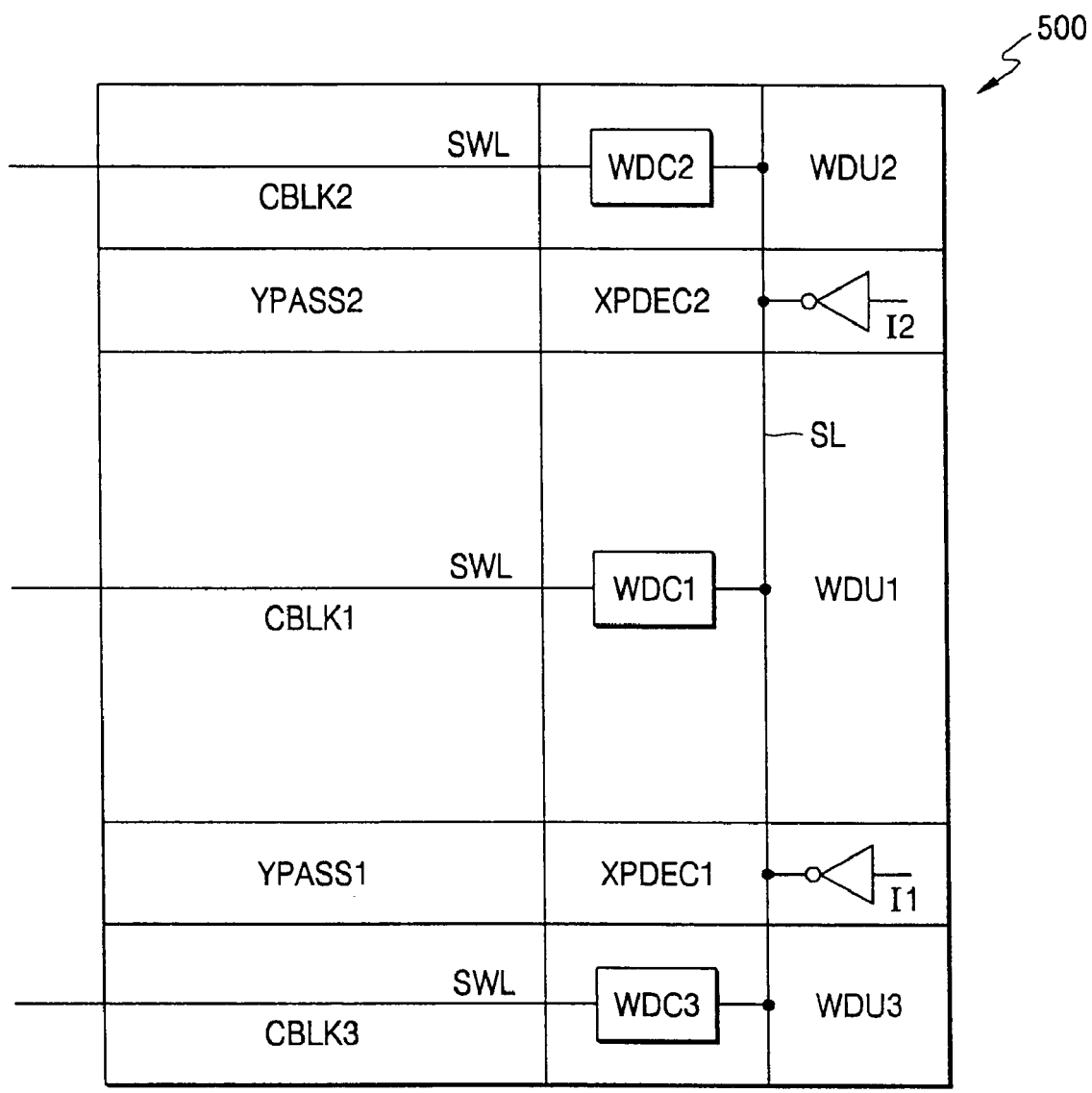
FIG. 5 is a block diagram of a semiconductor memory device according to still another embodiment of the present invention.

FIG. 5 is a block diagram of a semiconductor memory device 500 according to still another embodiment of the present invention.

Referring to FIG. 5, the semiconductor memory device 500 includes a word line driving unit WDU1 to drive a memory cell block CBLK1 and first and second decoding units XPDEC1 and XPDEC2 to control a word line driving circuit WDC1.

In FIG. 5, a first inverter I1 is included in the first decoding unit XPDEC1 and a second inverter I2 is included in the second decoding unit XPDEC2. The output terminals of the first and second inverters I1 and I2 are respectively connected to word line driving circuits WDC2 and WDC3 of word line driving units WDU2 and WDU3, which drive memory cell blocks CBLK2 and CBLK3 adjacent to the memory cell block CBLK1 in a column direction.

That is to say, in the semiconductor memory device 500, the first decoding unit XPDEC1 is shared by the memory cell blocks CBLK1 and CBLK3 and the second decoding unit XPDEC2 is shared by the memory cell blocks CBLK1 and CBLK2. Thus, the size of the core can be further reduced.

Figure 6:
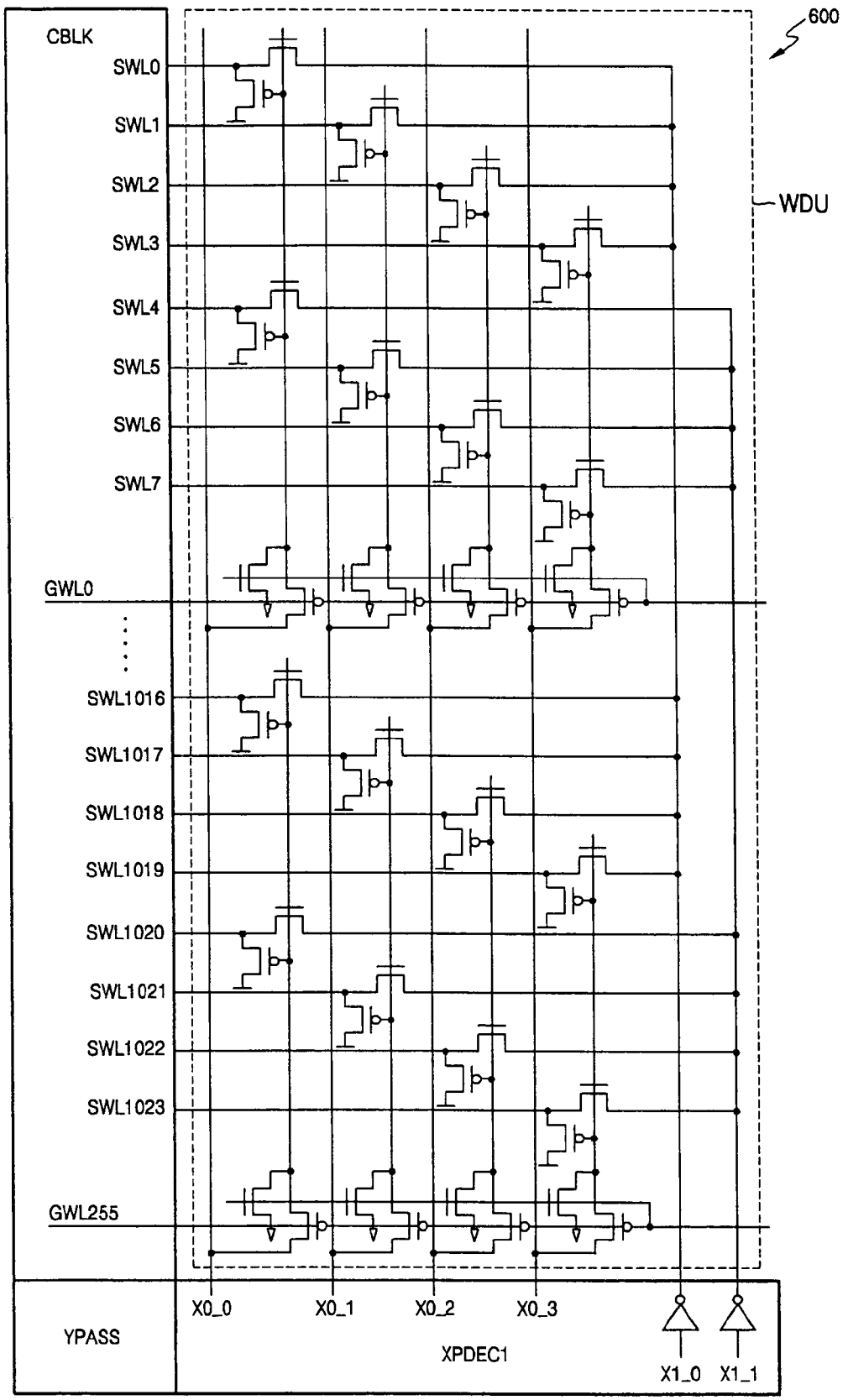
FIG. 6 is a circuit diagram of a semiconductor memory device according to yet another embodiment of the present invention.

FIG. 6 is a circuit diagram of a semiconductor memory device 600 according to yet another embodiment of the present invention.

In the semiconductor memory device 600 of FIG. 6, the number of sub word lines connected to a single global word line is greater than the number of the sub word lines connected to a single global word line of the semiconductor memory device 300 of FIG. 3. In FIG. 6, n, i.e., the number of the global word lines, is 128, and m, i.e., the number of the sub word lines connected to each global word line, is 8.

In the semiconductor memory device 600 of FIG. 6, the number of the sub word lines connected to the global word line is double than that in the semiconductor memory device 300 of FIG. 3. If the sub word lines connected to a global word line are selected in response to a single address signal as in the conventional semiconductor memory device 200 shown in FIG. 2, when the number of the sub word lines connected to the global word line is increased from 4 to 8, the number of metal lines transmitting the address signals must be proportionally increased from 4 to 8.

However, in the semiconductor memory device 600 according to the present embodiment, when the number of the sub word lines connected to the global word line is doubled from 4 to 8, only two additional metal lines are added. Consequently, the structure of the memory device according to the present embodiment is more effective in a larger memory array.

That is, more of the sub word lines can be connected to each of the global word lines than in the conventional semiconductor memory device without increasing the number of metal lines proportionally. Alternatively, if the number of the sub word lines connected to each of the global word lines is not increased, the reduction of the metal lines transmitting the address signals results in a reduction in the core layout size.

Figure 7:
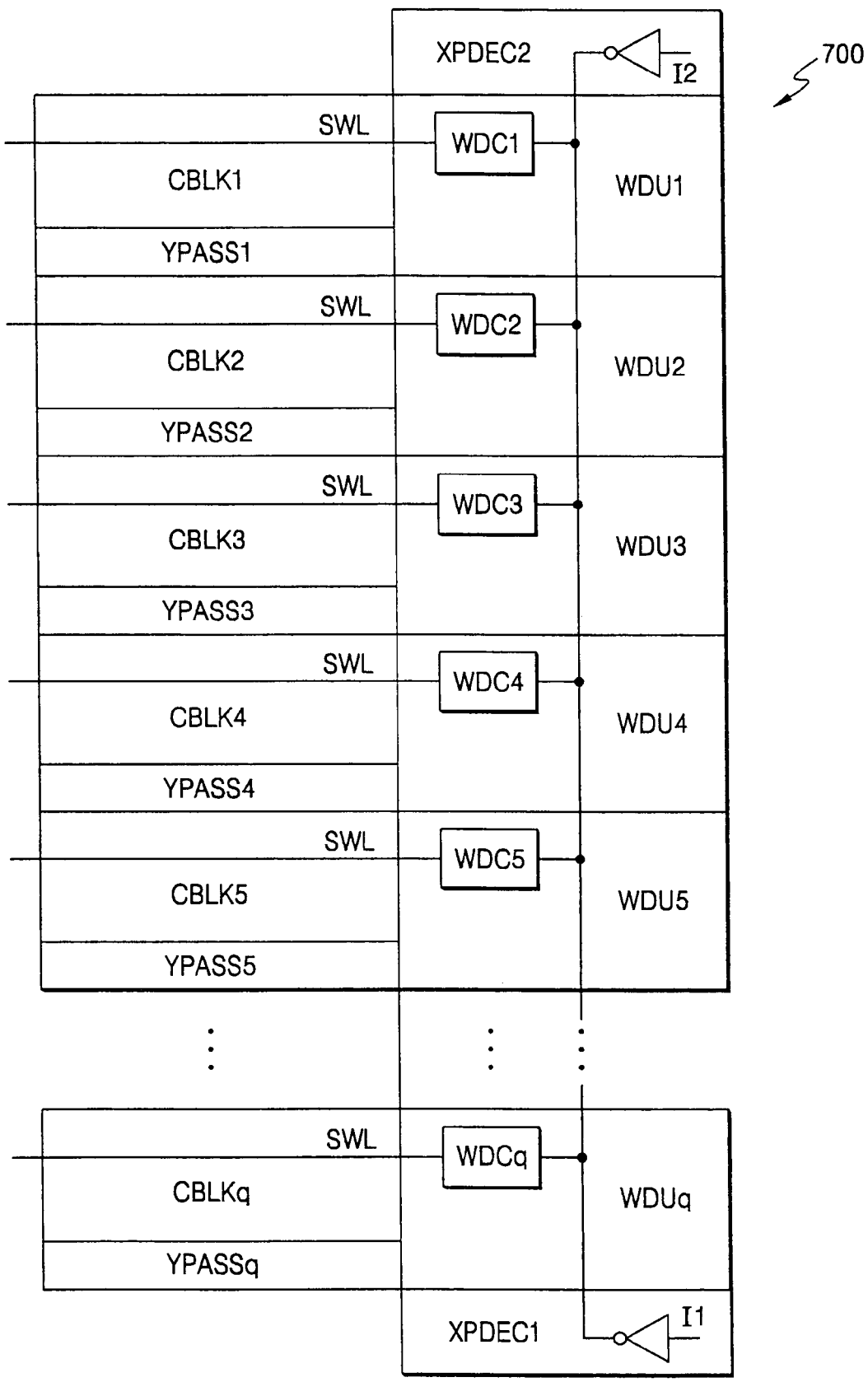
FIG. 7 is a block diagram of a semiconductor memory device according to another embodiment of the present invention.

FIG. 7 is a block diagram of a semiconductor memory device 700 according to another embodiment of the present invention.

Referring to FIG. 7, the semiconductor memory device 700 includes n global word lines, a plurality of memory cell blocks CBLK1-CBLKq, each of which includes m sub word lines corresponding to each of the global word lines, a plurality of word line driving units WDU1-WDUq respectively corresponding to the memory cell blocks CBLK1-CBLKq and driving the sub word lines included in the corresponding memory cell blocks CBLK1-CBLKq, and a first decoding unit XPDEC1 which decodes a j-bit first address signal and a k-bit second address signal and applies them to the word line driving units WDU1-WDUq.

Structures of each of the memory cell blocks CBLk-CBLKq and each of the word line driving units WDU1-WDUq are the same as those shown in FIG. 3. Word line driving circuits WDC1-WDCq are respectively included in the word line driving units WDU1-WDUq.

The semiconductor memory device 700 of FIG. 7 may further include the second decoding unit XPDEC2 included in the semiconductor memory device 400 of FIG. 4. Furthermore, the word line driving units WDU1-WDUq that drive the memory cell blocks CBLK1-CBLKq share the first decoding unit XPDEC1 and the second decoding unit XPDEC2. Accordingly, the size of the core layout can be further reduced.

Since the operations of the word line driving unit and the first and second decoding units XPDEC1 and XPDEC2 have been described, a detailed description will not be repeated.

As described above, in a semiconductor memory device according to the present invention, a word line driving circuit can be implement using only two transistors and the number of metal lines transmitting address signals is reduced, and thus, the size of the core can be reduced and a stable current sensing operation can be performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a memory cell block including n global word lines, and corresponding m sub word lines for each of the n global word lines, where n and m are natural numbers;
   a plurality of word line driving circuits which respectively control a voltage of the sub word lines according to a logic level of each corresponding global word line and inputted address signals; and
   a plurality of control circuits which transmit the address signals to the word line driving circuits or interrupt transmission of the address signals according to the logic level of the global word line,
   wherein each of the word line driving circuits includes a first transistor which maintains the voltage of the respective sub word line at a first voltage and a second transistor which maintains the voltage of the sub word line at the first voltage or a second voltage.

2. The semiconductor memory device of claim 1, wherein the address signals include j-bit first address signals which control the word line driving circuits and k-bit second address signals which control the voltages of the sub word lines, j and k are natural numbers, and wherein j×k=m.

3. The semiconductor memory device of claim 2, wherein each of the word line driving circuits maintains the voltage of the corresponding sub word line at the first voltage when the global word line is at a first logic level, and maintains the voltage of the corresponding sub word line at the first voltage or the second voltage according to the logic level of the second address signal when the global word line is at a second logic level and the first address signal is at the first logic level.

4. The semiconductor memory device of claim 2, wherein each of the control circuits includes first and second control transistors,
wherein the first control transistor includes a first terminal connected to gates of the first and second transistors of the corresponding word line driving circuit, a second terminal connected to a ground voltage, and a gate connected to the corresponding global word line, and
wherein the second control transistor includes a first terminal connected to the first terminal of the first control transistor, a second terminal receiving the corresponding first address signal, and a gate connected to the corresponding global word line.

5. The semiconductor memory device of claim 4, wherein the first transistor has a first terminal connected to a voltage source at the first voltage, a gate connected to the first terminal of the corresponding first control transistor and a second terminal connected to the corresponding sub word line, and
wherein the second transistor has a first terminal connected to the corresponding sub word line, a gate connected to the gate of the first transistor and a second terminal receiving the corresponding second address signal.

6. The semiconductor memory device of claim 5, further comprising:
k first inverters which respectively invert the inputted second address signal and having output terminals connected to the second terminals of the second transistors of the corresponding word line driving circuits.

7. The semiconductor memory device of claim 6, further comprising:
k second inverters which respectively invert the inputted second address signal and having output terminals connected to the second-terminals of the second transistors of the corresponding word line driving circuits,
wherein the output terminals of the first and second inverters which receive the same second address signal are connected to each other.

8. The semiconductor memory device of claim 7, further comprising:
word line driving units which respectively drive the memory cell block and adjacent memory cell blocks adjacent to the memory cell block in the column direction,
wherein the word line driving circuits are included in the word line driving units and the output terminals of the first and second inverters are connected to the word line driving circuits.

9. The semiconductor memory device of claim 1, wherein the first voltage is a supply voltage or a voltage obtained by clamping the supply voltage and is higher than the second voltage, and the second voltage is a ground voltage.

10. The semiconductor memory device of claim 1, wherein the memory cell block includes memory cells individually connected to the sub word lines, and each of the memory cells is a phase change memory element including a diode and a phase change resistance element connected between a corresponding bit line and a corresponding sub word line.

11. A semiconductor memory device comprising:
a memory cell block including n global word lines;
m sub word lines for each of the global word lines, wherein one of the sub word lines is selected in response to an activated global word line among the global word lines, j-bit first address signals and k-bit second address signals; and
a word line driving unit, corresponding to the memory cell block, which drives the sub word lines, and which includes is n×m word line driving circuits which maintain non-selected sub word lines at a first voltage and a selected sub word line at a second voltage,
wherein j, k, m and n a are natural numbers.

12. The semiconductor memory device of claim 11,
wherein each of the word line driving circuits maintains the voltage of the corresponding sub word line at the first voltage when the global word line is at a first logic level, and maintains the voltage of the corresponding sub word line at the first voltage or the second voltage according to the logic level of the second address signal when the global word line is at a second logic level and the first address signal is at the first logic level.

13. The semiconductor memory device of claim 11, wherein each of the word line driving circuits includes a first transistor which maintains the voltage of the corresponding sub word line at the first voltage and a second transistor which maintains the voltage of the corresponding sub word line at the first voltage or the second voltage,
wherein the first transistor has a first terminal connected to a first voltage source at the first voltage, and a second terminal connected to the corresponding sub word line, and
wherein the second transistor has a first terminal connected to the corresponding sub word line, and a second terminal receiving the second address signal.

14. The semiconductor memory device of claim 13, wherein the word line driving unit further includes a plurality of control circuits which respectively transmit the first address signals to the corresponding word line driving units or interrupt transmission of the first address signals according to the logic level of the global word line,
wherein each of the control circuits includes first and second control transistors:
wherein the first control transistor includes a first terminal connected to gates of the first transistor and the second transistor of the corresponding word line driving circuit, a second terminal connected to a ground voltage, and a gate connected to the corresponding global word line, and
wherein the second control transistor includes a first terminal connected to the first terminal of the first control transistor, a second terminal receiving the corresponding first address signal, and a gate connected to the corresponding global word line.

15. The semiconductor memory device of claim 13, further comprising:
k first inverters respectively which invert the second address signal and have output terminals connected to the second terminals of the second transistors of the corresponding word line driving circuits.

16. The semiconductor memory device of claim 15, further comprising:
k second inverters which invert the second address signals and having output terminals connected to the second terminals of the second transistors of the corresponding word line driving circuits,
wherein the output terminals of the first and second inverters which receive the same second address signal are connected to each other.

17. The semiconductor memory device of claim 16, further comprising:

word line driving units respectively driving the memory cell block and adjacent memory cell blocks adjacent to the memory cell block in the column direction, wherein the word line driving circuits are included in the word line driving units and the output terminals of the first and second inverters are connected to the word line driving circuits.

18. The semiconductor memory device of claim 11, wherein the first voltage is a supply voltage or a voltage obtained by clamping the supply voltage and is higher than the second voltage, and the second voltage is a ground voltage.

19. The semiconductor memory device of claim 11, wherein the memory cell block includes memory cells individually connected to the sub word lines, and each of the memory cells is a phase change memory element including a diode and a phase change resistance element connected between a corresponding bit line and a corresponding sub word line.

20. A semiconductor memory device comprising:
a plurality of memory cell blocks each including n global word lines and corresponding m sub word lines for each of the n global word lines, wherein one of the sub word lines is selected in response to an activated global word line among the global word lines, j-bit first address signals and k-bit second address signals;
a plurality of word line driving units, respectively corresponding to the memory cell blocks, which drive the sub word lines inside the memory cell blocks, and including n×m word line driving circuits which maintain non-selected sub word lines at a first voltage and a selected sub world line at a second voltage; and
a first decoding unit which decodes the first address signals and the second address signals and applies the first and second address signals to the word line driving unit,
wherein j, k, m and n are natural numbers and j×k=m.

21. The semiconductor memory device of claim 20, wherein each of the word line driving circuits maintains the voltage of the corresponding sub word line at the first voltage when the global word line is at a first logic level, and maintains the voltage of the corresponding sub word line at the first voltage or the second voltage according to the logic level of the second address signal when the global word line is at a second logic level and the first address signal is at the first logic level.

22. The semiconductor memory device of claim 20, wherein each of the word line driving circuits includes a first transistor which maintains the voltage of the corresponding sub word line at the first voltage and a second transistor which maintains the voltage of the corresponding sub word line at the first voltage or the second voltage,
wherein the first transistor has a first terminal connected to a first voltage source at the first voltage, and a second terminal connected to the corresponding sub word line, and
wherein the second transistor has a first terminal connected to the corresponding sub word line, and a second terminal which receives the second address signal.

23. The semiconductor memory device of claim 22, wherein each of the word line driving units further includes a plurality of control circuits which respectively transmit the first address signals to the corresponding word line driving circuits or interrupt transmission of the first address signals according to the logic level of the global word line,
wherein each of the control circuits includes first and second control transistors,
wherein the first control transistor includes a first terminal connected to gates of the first and second transistors of the corresponding word line driving circuit, a second terminal connected to a ground voltage, and a gate connected to the corresponding global word line, and
wherein the second control transistor includes a first terminal connected to the first terminal of the first control transistor, a second terminal receiving the corresponding first address signal, and a gate connected to the corresponding global word line.

24. The semiconductor memory device of claim 22, wherein the first decoding unit includes k first inverters which respectively invert the inputted second address signals and having output terminals connected to the second terminals of the second transistors of each of the word line driving circuits of the corresponding word line driving units.

25. The semiconductor memory device of claim 24, further comprising:
a second decoding unit including k second inverters which respectively invert the inputted second address signals and having output terminals connected to the second terminals of the second transistors of each of the word line driving circuits of the corresponding word line driving units,
wherein the output terminals of the first and second inverters which receive the same second address signal are connected to each other.

26. The semiconductor memory device of claim 20, wherein the first voltage is a supply voltage or a voltage obtained by clamping the supply voltage and is higher than the second voltage, and the second voltage is a ground voltage.

27. The semiconductor memory device of claim 20, wherein the memory cell block includes memory cells individually connected to the sub word lines, and each of the memory cells is a phase change memory element including a diode and a phase change resistance element connected between a corresponding bit line and a corresponding sub word line.

28. The semiconductor memory device of claim 11, wherein a sum of metal lines transmitting the j-bit first address signals and k-bit second address signals is less than m.

29. The semiconductor memory device of claim 22, wherein a sum of metal lines transmitting the j-bit first address signals and k-bit second address signals is less than m.

* * * * *